(12) United States Patent
Torazawa

(10) Patent No.: US 6,259,308 B1
(45) Date of Patent: Jul. 10, 2001

(54) OPTICAL COUPLING SEMICONDUCTOR SWITCHING CIRCUIT

(75) Inventor: Hiroyasu Torazawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/576,712

(22) Filed: May 23, 2000

(30) Foreign Application Priority Data

Jun. 7, 1999 (JP) .................................................. 11-158946

(51) Int. Cl.[7] .................................................. H01L 31/00
(52) U.S. Cl. .......................... 327/514; 327/515; 250/551
(58) Field of Search ................................... 327/514, 515; 250/551

(56) References Cited

U.S. PATENT DOCUMENTS 5,013,926 * 5/1991 Aizawa ................................ 250/551
5,138,177 * 8/1992 Morgan et al. ...................... 250/551
5,910,738 * 6/1999 Shinobe et al. ..................... 327/514

* cited by examiner

*Primary Examiner*—Kenneth B. Wells
*Assistant Examiner*—Paul Dinh
(74) *Attorney, Agent, or Firm*—Junichi Mimura

(57) ABSTRACT

An optical coupling semiconductor switching circuit to be coupled to a light emitting device for controlling electric circuits. The switching circuit includes a light detector generating voltage in response to light from the light emitting device and an impedance circuit having a first and a second output terminal. The impedance circuit is connected to the light detector and passes through a voltage input from the light detector to the output terminals with little loss. A plurality of switching devices are connected in parallel between the output. Each switching device includes at least a pair of transistors each having a gate connected to the first output terminal, and an optical rectifier that is activated by light from the light emitting device. The rectifier has a cathode connected to a source of each transistor and a anode connected to the second input terminal.

10 Claims, 4 Drawing Sheets

OPTICAL COUPLING SEMICONDUCTOR SWITCHING CIRCUIT

CROSS-REFERENCE TO RELATED APPLICATION

This application claims the priority benefit of Japanese Patent Application No. 11-158946, filed Jun. 7, 1999, the entire subject matter of which is incorporated herein of reference.

BACKGROUND OF THE INVENTION

1. Field of the Invention

The invention relates to an optical coupling semiconductor switching circuit which is operated by an optical signal.

2. Description of the Related Art

An optical coupling semiconductor switching circuit in the related art, which is operated by optical signals, includes a light detector, an impedance circuit, and a semiconductor switching device such as a FET transistor that is connected to electrical circuits. When the light detector receives light from a light emitting device, the light detector changes a light signal to an electric signal to generate voltage. The voltage, which is output from the light detector, is input to the impedance circuit. The semiconductor switching device is operated when the semiconductor switching device receives the voltage as a gate voltage from the light detector via the impedance circuit.

Since the impedance circuit is in a high impedance state when the voltage is applied to an input terminal of the impedance circuit, the voltage at the input terminal can be output effectively from first and second output terminals of the impedance circuit with little loss. Therefore, the semiconductor switching device whose gate is connected to the first output terminal is operated without fail. Further, while the light detector does not receive light so that the voltage is not applied to the input terminal of the impedance circuit, the impedance circuit is in low-impedance state. Thus, the connection of the impedance circuit is short-circuited between its output terminals. In this situation, as the charge at the gate of the semiconductor switching device rapidly discharges, the gate voltage falls rapidly. Therefore, speedy operation of the semiconductor switching device can be performed.

In the related art, it is required that a plurality of electrical circuits are operated by a single light signal. In this case, the same number of optical coupling semiconductor switching circuits as electrical circuits is formed. Each optical coupling semiconductor switching circuit has a light detector, an impedance circuit and a switching device, and is connected to respective electrical circuit. Thus, the overall circuit is both large and complicated.

SUMMARY OF THE INVENTION

An objective of the invention is to resolve the above-described problem and to provide an optical coupling semiconductor switching circuit having a simple structure, which operates a plurality of an electrical circuits with a single light signal.

The objective is achieved by an optical coupling semiconductor switching circuit to be coupled to a light emitting device for controlling electrical circuits, including a light detector generating voltage in response to light from the light emitting device, a low loss impedance circuit having a first and a second output terminal, which is connected to the light detector to receive the voltage from the light detector, and a plurality of switching devices in parallel connected between the output terminals. Each switching device includes a pair of transistors each having a gates connected to the first output terminal, and an optical rectifier that is activated by light from the light emitting device. The rectifier has a cathode connected to a source of each transistor and an anode connected to the second input terminal.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
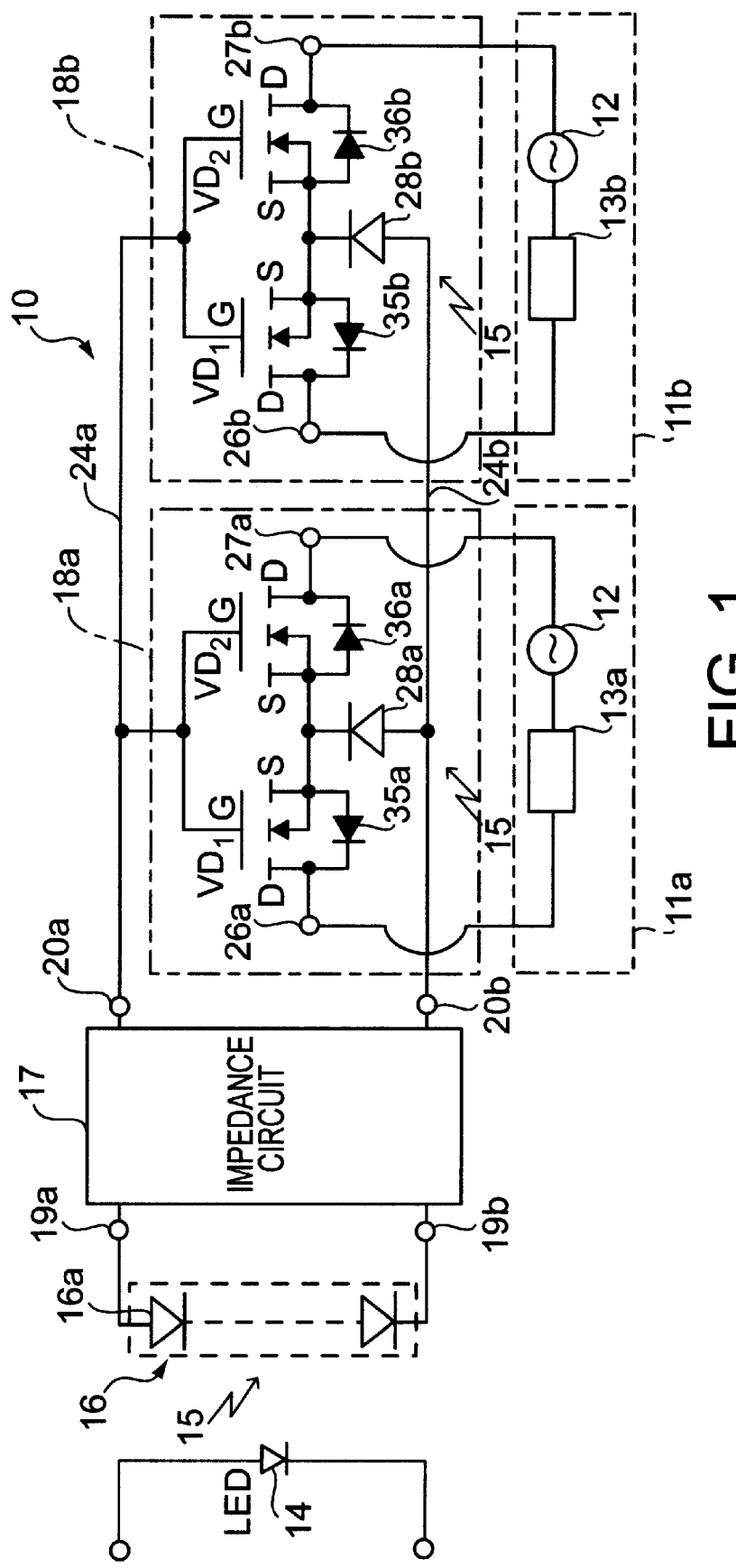
FIG. 1 is a circuit diagram of an optical coupling semiconductor switching circuit of a first of three illustrative embodiments of the invention.

Referring to FIG. 1, an optical coupling semiconductor switch circuit 10 of a first embodiment of the invention controls a pair of electrical circuits 11 (a first electrical circuit 11a and a second electrical circuit 11b) in response to a light signal which is generated by a a light emitting device 14, such as a light emitting diode (LED). In the first embodiment, each electrical circuit has an AC power supply 12 and a load circuit 13 operated by the AC power. The AC power is turned on or off by the optical coupling semiconductor switch circuit 10.

The optical coupling semiconductor switch circuit 10 has a light detector 16 which receives light 15 from the LED 14, an impedance circuit 17 connected to the light detector 16 and a plurality of semiconductor switching devices 18a, 18b, which are connected to the impedance circuit, for each electrical circuit 11a, 11b. The LED 14 radiates pulsating light 15 in response to a pulse signal, which is applied to the LED 14. The light detector 16 has a photoelectric conversion feature, and includes a plurality of photodiode 16a connected to each other in series. When each photodiode 16a receives the pulsating light 15, it generates a voltage corresponding to the light intensity. As the desired amount of voltage to be generated can be set by selection of the number of photodiodes 16a.

The impedance circuit 17 has a first input terminal 19a which is connected to the anode of the first of the series connected photodiodes 16a, a second input terminal 19b which is connected to the cathode of the last of the photodiodes 16a, a first output terminal 20a corresponding to the first input terminal 19a and a second output terminal 20b corresponding to the second input terminal 19b. The impedance circuit 17 outputs voltage biased between its input terminals 19a, 19b to its output terminals 20a, 20b. When the light detector 16 receives the light 15, the first output terminal 20a corresponding to the first input terminal 19a becomes a positive electrode because the first input terminal is connected to the anode of the first photodiode. Therefore, a positive electric potential is applied to the first output terminal 20a. On the other hand, since the second output terminal 20b becomes a negative electrode, the ground potential is applied there.

While voltage is applied between the input terminals 19a, 19b of the impedance circuit 17, a high impedance state is given to the circuitry (18a, 18b) between the output terminals 20a, 20b. Therefore, the voltage biased between its input terminals 19a, 19b is output to its output terminals 20a, 20b with little loss. While the light detector 16 is not receiving light, no voltage is applied between the input terminals 19a, 19b. Therefore, the circuitry (18a, 18b) between the output terminals 20a, 20b is in a low impedance state. This means that the output terminals 20a, 20b are substantially short-circuited to each other.

Figure 2:
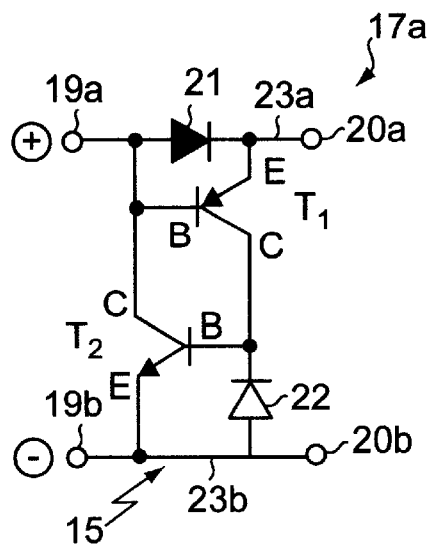
FIG. 2 is a circuit diagram of a first impedance circuit that is used in each of the three embodiments.
Figure 3:
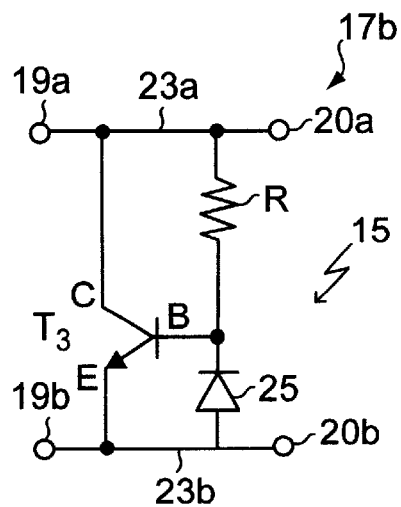
FIG. 3 is a circuit diagram of a first impedance circuit that is used in each of the three embodiments.

Alternative embodiments of the impedance circuit 17 are the circuit 17a shown in FIG. 2 and the circuit 17b shown in FIG. 3. These impedance circuits 17a, 17b can be used not only in the first embodiment, but also in second and third embodiments described later. The impedance circuit 17a shown in FIG. 2 includes a diode 21 that is formed on a positive potential output line 23a, between the first input terminal 19a and the first output terminal 20, a PNP transistor T1, a NPN transistor T2 and a photodiode 22. The anode of the diode 21 is connected to the first input terminal 19a. The photodiode 22 also receives the light 15 from the LED 14 whenever the light detector receives the light 15. An emitter E and a base B of the PNP transistor T1 are connected to the cathode and the anode of the diode 21, respectively. A collector C of the PNP transistor T1 is connected to a base B of the NPN transistor T2 and a cathode of the photodiode 22. A collector C of the NPN transistor T2 is connected to the base B of the PNP transistor T1. An emitter E of the NPN transistor T2 is commonly connected to an anode of the photodiode and a ground line 23b which connects the second input terminal 19a to the second output terminal 20b.

When a positive potential, which is generated by the light detector 16 with the light 15, is applied to the first input terminal 19a, the photodiode 22, which also receives the light 15, generates a voltage. Accordingly, an electric potential at the base B of the NPN transistor T2 becomes lower than that at its emitter E. This turns off the NPN transistor T2. Further, as the voltage level between the base B and emitter E of the PNP transistor T1 is maintained, the PNP transistor T1 stays off.

As a result, since high impedance state is maintained between the input terminals 20a, 20b by the off-state of the PNP transistor T1, the off-state of the NPN transistor T2 and the photodiode 22, while a positive electric potential is applied to the first input terminal 19a, the positive electric potential at the first input terminal 19a is output to a first output line 24a connected to the first output terminal via the diode 21 with little loss.

While the light detector 16 receives no light, the photodiode 22 generate no voltage. Also, when positive electric charge stored at the gate of the switching device 18a, 18b is input to the emitter E of the PNP transistor T1 via the first output line 24a, the electric potential at the base B of the PNP transistor T1 becomes lower than that at the emitter E of the PNP transistor T1. Therefore, the PNP transistor T1 turns on. As the emitter/collector current across the PNP transistor T1 is blocked by the photodiode 22, the flow of current is introduced to the NPN transistor T2. Therefore, the NPN transistor T2 turns on. As a result, the connection between the output terminals 20a, 20b is substantially opened since the low impedance state is appeared between the input terminals 20a, 20b by the PNP transistor T1, and the NPN transistor T2 while no voltage is applied between the input terminals 19a, 19b.

The alternative impedance circuit 17b shown in FIG. 3 includes a NPN transistor T3 whose collector C is connected to a positive potential output line 23a and whose emitter E is connected to a ground line 23b. The output line 23a connects the first input terminal 19a to the first output terminal 20a. A bias resistor R is provided between the base B of the NPN transistor T3 and the output line 23a. A photodiode 25 is provided to turn off the NPN transistor T3 between the emitter E and the base B when the light 15 is received. The photodiode 25 acts as a block against the current flow from the bias resistor R to the ground line 23b because the output of the photodiode 25 is connected to the bias resistor R and the input of the photodiode 25 is connected to the ground line 23b.

As well as the operation of the impedance circuit 17a shown in FIG. 2, the high impedance state is maintained between the input terminals 20a, 20b by the off-state NPN transistor T3 and the photodiode 22 while the positive electric potential is applied to the first input terminal 19a, in the impedance circuit 17b. Therefore, the positive electric potential at the first input terminal 19a is output to the first output line 24a which is connected to the first output terminal with little loss.

While the light detector receives no light, the photodiode 25 generates no voltage. Positive electric charge stored at the gate of the switching device 18a, 18b is applied between the collector C and the base B of the NPN transistor T3 via the first output line 24a. Further, as the bias resistor R is formed between the base B of the transistor T3 and the output line 23a, the electric potential at the base B is lower than that at the emitter E. Therefore, the NPN transistor T3 turns on. As a result, the circuit between the output terminals 20a, 20b is substantially opened since the low impedance state is appeared between the input terminals 20a, 20b by the NPN transistor T3 while no voltage is applied between the output terminals 19a, 19b.

As note earlier, the impedance circuits 17a, 17b are merely examples. Other impedance circuits can be used if they have characteristics of high impedance between its output terminals while a voltage is applied between the input terminals 19a, 19b, and low impedance between its output terminals while no voltage is applied between the input terminals 19a, 19b.

Referring again to FIG. 1, the switching devices 18a, 18b are respectively connected to the electrical circuits 11a, 11b at first nodes 26a, 26b and at second nodes 27a, 27b. Each switching device 18a, 18b includes optical rectifiers 28a, 29b and a pair of VDMOS transistors VD1, VD2 (a first VDMOS transistor VD1 and a second VDMOS transistor VD2). Each rectifier 28a, 18b is connected between the VDMOS transistors VD1, VD2 and the second output terminal 20b of the impedance circuit 17. The VDMOS transistors VD1, VD2 are a vertical double diffusion MOS transistors, and have a high withstand voltage characteristic.

Figure 4:
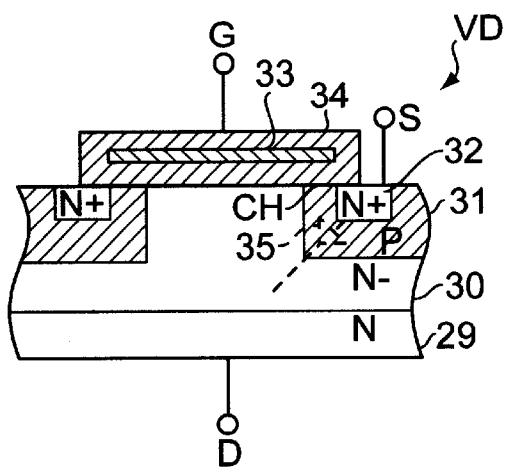
FIG. 4 is a sectional view of a VDMOS transistor that is used in a switching device in each of the three embodiments.

Referring to FIG. 4, the VDMOS VD includes an n-type semiconductor substrate 29, an epitaxial layer 30 having the same conductivity type as the substrate 29, but whose impurity density is lighter that that of the substrate 29, which is formed on the substrate 29. A ring-shaped, p-type, well layer 31 is formed on the epitaxial layer 30. Further, a ring-shaped, n-type, highly doped area 32 is formed in the well layer 31. The area 32 serving as a source of the VDMOS transistor VD, is connected to a source electrode S. A drain electrode D is connected to the bottom of the substrate 29. A gate 33 is formed on a gate insulating layer 34 that is formed on the epitaxial layer 30, and a gate electrode G is connected to the gate 33.

In the VDMOS transistor VD, a channel CH corresponding to the gate voltage is formed at the surface of well layer 31 between the area 32 and the epitaxial layer 30. Thus, when the voltage is applied between the source and the drain while the source is the negative pole and the drain is positive pole, the electrical connection between the source and the drain at the channel CH is opened and closed by switching the gate voltage off and on. By applying the voltage between the source and the drain, a parasitic diode 35 to which the reverse-direction voltage is applied is formed in the well layer 31 and the epitaxial layer 30. As the parasitic diode 35 forms a depletion layer in the eptaxial layer 30 while no voltage is applied to the gate, a high withstand voltage characteristic between the source and drain can be obtained.

Referring again to FIG. 1, the switching devices 18a, 18b are connected in parallel between the first output line 24a and a second output line 24b by connecting the gates of their VDMOS transistors VD1, VD2 to the first output line 24a and by connecting the sources of their VDMOS transistors VD1, VD2 via optical rectifier 28a, 28b to the second output line 24b. The second output line 24b is connected to the second output terminal of the impedance circuit 17. As the first and second switching devices 18a, 18b have the same structure, the following description is focussed only on the first switching device 18a.

The source of the first and second VDMOS transistors VD1, VD2 commonly connected to each other and their drains are connected to the nodes 26a, 27a, respectively, for the connection to the electrical circuit 11a. Further, as the sources are commonly connected, the forward direction of each parasitic diode 35, which is formed between the source and the drain, is facing in the opposite direction of the electrical circuit 11a. The rectifier 28a, which connects the first and second VDMOS transistors VD1, VD2 to the output 24b, is a photodiode that receives the light 15 simultaneously with receipt thereof by the light detector 16. The photodiode 28a is a high withstand voltage photodiode whose a breakdown voltage against the micro-current flowing in the reverse direction is higher than the withstand voltage of each VDMOS transistor VD1, VD2. The cathode of the photodiode 28a is connected to the sources of the VDMOS transistors VD1, VD2, and its anode is connected to the second output line 24b.

When the light detector 16 is not receiving the light 15, an electric potential is not applied to the gates of the VDMOS transistors VD1, VD2 because no voltage is output from the impedance circuit 17. Further, since the photodiode 28a also is not receiving the light 15, the connection between the sources of the VDMOS transistors VD1, VD2 and the second output terminal 20b is opened.

Furthermore, although an alternating voltage from the AC power supply 12 is applied to the drains of the VDMOS transistor VD1, VD2 through the nodes 26a, 27a so as to switch the polarity alternatingly, the connection between the nodes 26a, 27a is not substantially closed. That is because the parasitic diodes 35 formed in the VDMOS transistors VD1, VD2, face in opposite directions so as to operate as the reverse-direction-connection, alternatingly. Therefore, the operation of the load circuit 13 by the AC power supply 12 is halted.

On the other hand, when the light detector 16 receives the light 15, a predetermined voltage is applied between the output terminals 20a, 20b of the impedance circuit 17. Simultaneously, as the photodiode 28a in the switching device 18a receives the light 15, the photodiode 28a allows a micro-current corresponding to the power generated by the photodiode 28a to flow across the photodiode 28a in the direction from the cathode to the anode of the photodiode 28a. Therefore, the electrical connection between the source of the VDMOS transistors VD1, VD2 and the second output terminal 20b is closed. Accordingly, the voltage applied between the output terminals 20a, 20b of the impedance circuit 17 is rapidly applied between the source and gate of the each VDMOS transistor VD1, VD2.

When the voltage is applied between the source and gate, the electrical connection is closed between the source and drain in one of the VDMOS transistor VD1, VD2 to which the negative voltage is being applied. In the other VDMOS transistor VD2, VD1, the electric current flows from the source to the drain via parasitic diode 35. As mentioned before, the same operation is performed in the second switching device 18b which is connected in parallel to the first switching device 18a.

As a result of the operation that the connections at the nodes 26a, 27a, which is connected to the switching devices 18a, 18b, are closed by the switching devices 18a, 18b when the light detector 16 receives the light 15, it is possible to operate each load circuit 13a, 13b by respective AC power source 12 with a single impedance circuit 17 by the operation of the switching devices 18a, 18b.

According to the optical coupling semiconductor switching circuit 10 of the first embodiment, the leakage current between the electrical circuits 11a, 11b by the operation of the switching device can be avoided by the rectifying effects obtained by use of the photodiodes 28a, 28b. Further, as the current through the photodiodes 28a, 28b in the forward direction is restricted less than the current generated by the photodiodes 28a, 28b, an electric current across each electrical circuit 11a, 11b is not influenced by the electric current in the forward direction across each photodiode 28a, 28b.

Further, as a voltage which is generated by the photodiodes 28a, 28b can be established at a desired value by changing the size of a light-receiving area of each photodiode 28a, 28b, it is also possible to avoid leakage of current across the electrical circuit to the photodiodes 28a, 28b, and to easily design the optical coupling semiconductor switching circuit with best characteristics for rapidly applying a potential to each gate of each VDMOS transistor VD1, VD2.

When the LED 14 turns off, the charge at each gate of the VDMOS transistor VD1, VD2 is rapidly discharged because the impedance across the output terminals 20a, 20b of the impedance circuit is low. Therefore, the operations for opening the switching devices 18a, 18b are performed rapidly.

Figure 5:
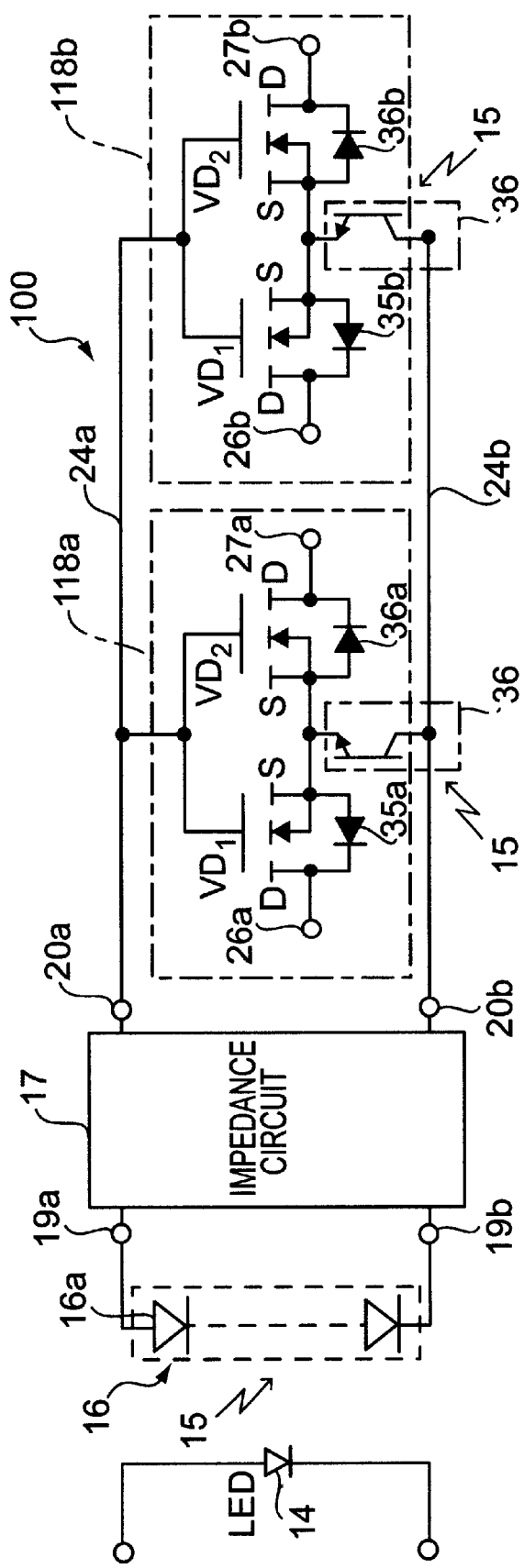
FIG. 5 is a circuit diagram of an optical coupling semiconductor switching circuit of a second embodiment of the invention.

Referring to FIG. 5 illustrating a coupling semiconductor switching circuit 100 according to the second embodiment of the invention, phototransistors 36 are used as the rectifiers in a second embodiment of the invention, in place of a photodiode of the first embodiment.

The phototransistor 36 of each switching device 118a, 118b is connected between the sources of the VDMOS transistors VD1, VD2 and the second output line 20b. The forward current is passed through the phototransistor 36 from the second output line 20b to the sources of the VDMOS transistors VD1, VD2. The phototransistor 36 has a breakdown voltage which is higher than that of each VDMOS transistor VD1, VD2, which is a factor in determining the withstand voltage characteristics of each switching device 18a, 18b.

Figure 6:
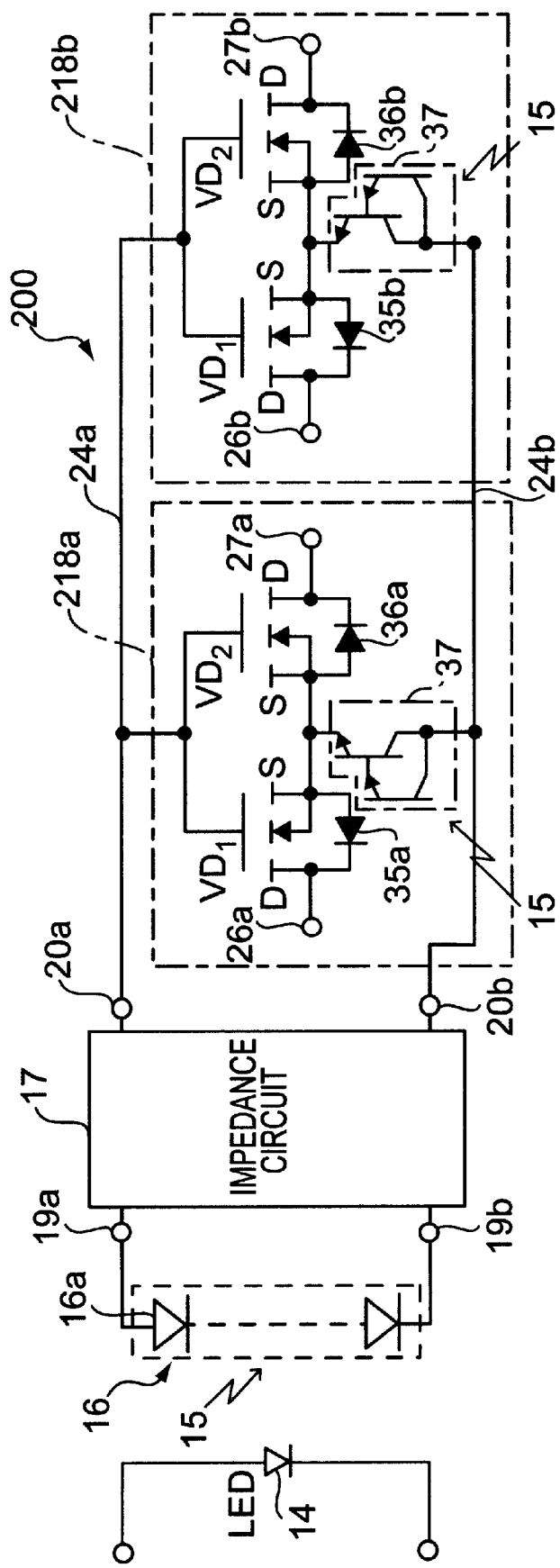
FIG. 6 is a circuit diagram of an optical coupling semiconductor switching circuit of a third embodiment of the invention.

Further, referring to FIG. 6 illustrating a coupling semiconductor switching circuit 200 according to the third embodiment of the invention, a Darlington circuit 37, which is a combination of a phototransistor and a transistor with a Darlington connection, is used as the rectifier, in place of the photodiode 36 of the second embodiment. The Darlington circuit 37 which is used in the coupling semiconductor switching circuit 200 is connected between the sources of the VDMOS transistors VD1, VD2 and the second output line 20b. The forward current is passed through the Darlington circuit 37 from the second output line 20b to the sources of the VDMOS transistors VD1, VD2. The Darlington circuit 37 has a breakdown voltage, which is higher than that of each VDMOS transistor VD1, VD2.

In the second and third embodiment, the leakage current between the electrical circuits 11a, 11b can be avoided because of the rectifier characteristics of the phototransistor 36 and the Darlington circuit 37. Therefore, each electrical circuit 11a, 11b which is connected to each switching device can be completely electrically isolated from each other. On the other hand, both the phototransistor 36 and the Darlington circuit 37 allow a micro-current corresponding to each power generated by themselves to flow across them in the direction from the cathode to the anode of the phototransistor 36 or of the phototransistor of the Darlington circuit 37. Therefore, the connection between the source of the VDMOS transistors VD1, VD2 and the second output terminal 20b is closed. Accordingly, the voltage applied between the output terminals 20a, 20b of the impedance circuit 17 is rapidly applied between the source and gate of the each VDMOS transistor VD1, VD2.

Although the electrical circuit is operated by an AC power source in each embodiment, it is possible to use the optical coupling semiconductor switching circuit for electrical circuits which is operated by a DC power source. In this case, each switching device includes, in place of a pair of VDMOS transistors, a single VDMOS transistor whose source is connected to the negative pole node and whose drain is connected to the positive pole node.

Further, although the VDMOS transistor is used in each embodiment, a horizontal MOS having a source and a drain that are formed in the same surface of the semiconductor substrate also could be used. If the horizontal MOS is used, each switching device includes a single horizontal MOS transistor instead of a pair of VDMOS transistors, regardless of the operating type (AC operation/DC operation) of the electrical circuit, because a pair of impurity regions acting for a source and a drain function as the source an the drain complementary corresponding to the voltage pole applied therebetween. Furthermore, a bipolar transistor can be used in the switching device, in each embodiment.

Further, although two switching devices are connected in parallel between the first and second outputs in each embodiment, three switching devices or more can be connected in parallel between the first and second output terminals of the impedance circuit.

While the invention has been described with reference to illustrative embodiments, this description is not intended to be construed in a limiting sense. Various modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. An optical coupling semiconductor switching circuit to be coupled to a light emitting device for controlling electrical circuits, comprising:

a light detector generating voltage in response to light from the light emitting device;

a low loss impedance circuit having a first and a second output terminal, which is connected to the light detector to receive the voltage from the light detector; and a plurality of switching devices connected in parallel between the output terminals, each switching device having at least one transistor having a gate connected to the first output terminal, and a rectifier that is activated by light from the light emitting device, the rectifier having a cathode connected to a source of the transistor and an anode connected to the second input terminal.

2. An optical coupling semiconductor switching circuit as claimed in claim 1, wherein the rectifier has a breakdown voltage value that is higher than a withstand voltage value of the transistor.

3. An optical coupling semiconductor switching circuit as claimed in claim 1, wherein the rectifier is a photodiode.

4. An optical coupling semiconductor switching circuit as claimed in claim 1, wherein the rectifier is a phototransistor.

5. An optical coupling semiconductor switching circuit as claimed in claim 1, wherein the rectifier is a Darlington circuit having a phototransistor and a transistor which are connected by a Darlington connection, the phototransistor having an emitter connecting to a gate of the transistor.

6. An optical coupling semiconductor switching circuit as claimed in claim 1, wherein the transistor of the switching device is a VDMOS transistor.

7. An optical coupling semiconductor switching circuit as claimed in claim 1, wherein the transistor of the switching device is a horizontal MOS transistor.

8. An optical coupling semiconductor switching circuit as claimed in claim 1, wherein the transistor of the switching device is a bipolar transistor.

9. An optical coupling semiconductor switching circuit as claimed in claim 1, wherein the electric current is an AC current and the switching device includes a pair of transistors.

10. An optical coupling semiconductor switching circuit as claimed in claim 9, wherein the transistors of the switching device are VDMOS transistors.

* * * * *